(12) United States Patent
Koo et al.

(10) Patent No.: US 8,760,040 B2
(45) Date of Patent: Jun. 24, 2014

(54) POLYMER BLEND COMPOSITION AND TUNABLE ACTUATORS USING THE SAME

(75) Inventors: Chong-Min Koo, Gyeonggi-do (KR); Kyung-Youl Baek, Seoul (KR); Soon-Man Hong, Seoul (KR); Seung-Sang Hwang, Seoul (KR); Hee-La Kwak, Seoul (KR); Kyung-ho Min, Chungbuk (KR); Jin-Hong Lee, Busan (KR); Kie-Yong Cho, Gyeonggi-do (KR); Sang-Hee Park, Gyeongsangnam-do (KR)

(73) Assignee: Korea Institute of Science and Technology, Seoul (KR)

( * ) Notice: Subject to any disclaimer, the term of this patent is extended or adjusted under 35 U.S.C. 154(b) by 98 days.

(21) Appl. No.: 13/288,503

(22) Filed: Nov. 3, 2011

(65) Prior Publication Data

US 2012/0248945 A1    Oct. 4, 2012

(30) Foreign Application Priority Data

Apr. 1, 2011   (KR) .................. 10-2011-0030273

(51) Int. Cl.
| | | |
|---|---|---|
| C08L 27/16 | (2006.01) | |
| H01L 41/193 | (2006.01) | |
| C08F 20/10 | (2006.01) | |
| C08J 5/18 | (2006.01) | |
| C08L 33/12 | (2006.01) | |
| C08L 53/00 | (2006.01) | |
| H01L 41/22 | (2013.01) | |

(52) U.S. Cl.
USPC ................. 310/365; 525/93; 525/94; 525/95; 525/98; 525/92 C

(58) Field of Classification Search
USPC ................. 525/93, 94, 95, 98, 92 C; 310/365
See application file for complete search history.

(56) References Cited

U.S. PATENT DOCUMENTS

| | | | |
|---|---|---|---|
| 6,355,749 B1 | 3/2002 | Chung et al. | |
| 7,049,732 B2 | 5/2006 | Pei et al. | |
| 7,068,976 B2 | 6/2006 | Shepherd et al. | |
| 7,144,952 B1 * | 12/2006 | Court et al. | .......... 525/94 |
| 2006/0063891 A1 * | 3/2006 | Ruzette et al. | ........ 525/330.3 |
| 2010/0148635 A1 | 6/2010 | Kwon et al. | |

OTHER PUBLICATIONS

Himori, translation of JP 63-308055, Dec. 1988.*
Cheng Huang, et al; "Fully Functionalized High-Dielectric-Constant Nanophase Polymers with High Electromechanical Response", Advanced Materials, vol. 17, Issue 9, pp. 1153-1158, May 2005 (First Published Online: Apr. 25, 2005).
Q.M. Zhang, et al; "Giant Electrostriction and Relaxor Ferroelectric Behavior in Electron-Irradiated Poly(vinylidene Fluoride-trifluoroethylene) Copolymer", Science Jun. 26, 1998: vol. 280 No. 5372, pp. 2101-2104 DOI: 10.1126/science.280.5372.2101.

* cited by examiner

*Primary Examiner* — Jeffrey Mullis
(74) *Attorney, Agent, or Firm* — Ladas & Parry LLP

(57) ABSTRACT

The present invention relates to one of energy conversion devices, actuator and a dielectric layer used in the actuator. The present invention provides a polymer blend composition capable of easily controlling the ability of converting electrical energy to mechanical energy, which is prepared by blending a piezoelectric polymer with a flexible elastomeric block copolymer showing an effective miscibility therewith, and a tunable actuator using the same.

9 Claims, 4 Drawing Sheets poly(vinylidene fluoride-co-trifluoroethylene)

PMMA    PDMA    PMMA

PMMA-b-PDMA-b-PMMA block copolymer(BCP)

15wt% BCP  90wt% BCP  100wt% BCP

100wt% PMMA-b-PDMA-b-PMMA

90wt% PMMA-b-PDMA-b-PMMA

15wt% PMMA-b-PDMA-b-PMMA

POLYMER BLEND COMPOSITION AND TUNABLE ACTUATORS USING THE SAME

CROSS-REFERENCE TO RELATED APPLICATION

This application claims priority to and the benefit under 35 U.S.C. §119(a) of a Korean patent application No. 10-2011-0030273 filed on Apr. 1, 2011, the entire disclosure of which is incorporated herein by reference for all purposes.

BACKGROUND OF THE INVENTION (a) Field of the Invention

The present invention relates to a polymer blend composition and a tunable actuator using the same. More particularly, the present invention relates to a blend composition of a ferroelectric or piezoelectric PVDF-based polymer material and a block copolymer including poly(methylmethacrylate) (hereinafter, referred to as PMMA) miscible with PVDF and a soft polymer having a glass transition temperature below room temperature, and a tunable polymer actuator using the same.

(b) Description of the Related Art

Piezoelectric ceramic materials have been conventionally used as an element for converting electrical energy into mechanical energy, which is usable in robotics, pumps, speakers, disk drives and camera lenses. However, the piezoelectric ceramic materials have the drawbacks of high brittleness and relatively high fabrication costs.

On the contrary, piezoelectric polymer materials have recently gained interest as a material to overcome the above mentioned drawbacks of the ceramic materials, because they have a high power/weight ratio and high efficiency and are very flexible and easy to process. Unlike traditional hydraulic or aerodynamic actuators, piezoelectric polymer materials can be used to design a compact device with no life-limited components such as gears and bearings.

There are piezoelectric polymer materials such as poly(vinylidene fluoride) (hereinafter, referred to as PVDF) and its copolymer poly(vinylidene fluoride)-co-trifluoroethylene, nylon, cyanopolymer, polyurea and polythiourea. In particular, PVDF is flexible, lightweight, tough engineering plastic available in a wide variety of thicknesses and large areas. In addition, since PVDF has the characteristics of having a wide frequency range of 1-10 MHz and converting a minute mechanical stimulation into large electrical signals, the PVDF films are applied to various fields such as switches, computer graphics and electronic games, robot touch sensors, infrared sensors, medical sensors, pickups for musical instruments, and military underwater sound detectors. The piezoelectric property of PVDF is due to beta and gamma crystals, but PVDF is disadvantageous in that it has a significantly smaller piezoelectric constant than most piezoelectric ceramic materials. To improve its piezoelectric property, there is also an inconvenience in that a complex process such as poling and drawing is additionally performed to form beta crystals.

In order to address these problems, PVDF copolymers with trifluoroethylene and tetrafluoroethylene have been prepared to improve its piezoelectric property. Among them, poly(vinylidene fluoride-co-trifluoroethylene) (hereinafter, referred to as PVDF-TrFE) prepared by copolymerization with trifluoroethylene stably crystallizes into the beta crystals without the additional process such as poling and drawing, compared to PVDF. This results in a larger piezoelectric response, and d33 values for PVDF-TrFE is as high as 38 pC/N versus 33 pC/N in pure PVDF. In addition, the materials have a high ferroelectricity (the ability of a material to change its direction of spontaneous polarization in response to application of an electric field), and the highly ferroelectric materials have a wide range of applications such as memory storage elements. However, ferroelectric materials exhibit a hysteresis behavior, making it difficult to control the strain according to applied voltages. The materials are also considerably rigid in themselves, and thus they are needed to be slightly modified for actuator applications.

In order to reduce hysteresis for actuator applications, studies have been made on methods for preparing relaxor ferroelectric materials. At Pennsylvania State University, Qiming Zhang and his research group have fabricated an actuator having more excellent performances by introducing structural defects via high-energy electron irradiation of poly(vinylidene fluoride-trifluoroethylene or by synthesizing a terpolymer with incorporation of a smaller amount of bulky monomers (chlorofluororthylene, hexafluorpropene) into the polymer, thereby increasing a strain (in the thickness direction) of PVDF actuator from 2% up to 7% (Patent literature 1, Non-Patent literature 2).

In order to impart more excellent properties, addition of fillers to the above material has been also studied. However, preparation of composites by the addition of fillers is disadvantageous in that dielectric loss generated by filler aggregation is increased or a dielectric strength and a breakdown voltage are reduced to deteriorate the stability.

To solve these problems, chemical grafting of copper (Cu) phthalocyanine or aniline oligomer is performed during the synthesis step so as to mix the filler ingredients with a polymer matrix at a molecular level, thereby improving actuator performance and minimizing dielectric loss and the reduction in dielectric strength (Non-Patent literature 1).

An actuator including a piezoelectric layer is advantageous in that it is driven by the application of an external electric field to convert electrical energy into mechanical energy very quickly.

Meanwhile, operation of the actuator including a piezoelectric layer is conducted according to an electrostrictive mechanism. When an external electric field is applied to the piezoelectric layer, electronic polarization occurs in the piezoelectrics. Piezoelectric deformations in the molecular chains can be generated by the field-induced polarization. The generated piezoelectric strain (X) is proportional to the applied external electric field (E) and a piezoelectric constant (d) (x=dE). This can be also expressed by a displacement (D) being proportional to the applied stress (X) and the piezoelectric constant (d) (D=dX).

Based on the electrostrictive mechanism, the actuator can be more easily driven by reducing an energy barrier needed for the deformation, for example, introduction of structural defects via high-energy electron irradiation or synthesis of a terpolymer with incorporation of a smaller amount of bulky monomers, accomplished by Qiming Zhang and his research group.

However, the above-mentioned prior art is problematic in that the severe crosslinking side reaction occurs during the high-energy radiation and a complex and laborious chemical process has to be performed for each synthesis and purification of terpolymers or grafted polymers having various compositions in order to control the perfomiance.

Further, Patent literatures 2 and 3 reported that a type or concentration of curing agent, pre-strain or degree of crosslinking is controlled to improve the actuator performance, or a matrix stable in a liquid electrolyte can be developed when used as an ionic actuator. Furthermore, Patent literatures 4 and 5 reported that a PVDF copolymer of P(VDF-CTFE) or P(VDF-TrFE-CTFE) is used to convert the piezoelectric into a relaxor ferroelectric material, thereby reducing the strain hysteresis according to the piezoelectric property. Up to now, however, Not many attention was spotted onto an actuator of which performance is controlled by blending two polymers with different physical properties to have miscibility.

PRIOR ART DOCUMENTS

Patent Literatures (Patent literature 1) U.S. Pat. No. 6,355,749
(Patent literature 2) U.S. Pat. No. 7,049,732
(Patent literature 3) US Patent Publication No. 2010/0148635
(Patent literature 4) U.S. Pat. No. 7,068,976
(Patent literature 5) U.S. Pat. No. 6,355,749

Non-Patent Literatures (Non-Patent literature 1) Cheng Huang and Qiming Zhang, Fully Functionalized High-Dielectric constant nanophase polymers with high electromechanical response, Adv. Mater. 2005, 17, 1153-1158
(Non-Patent literature 2) Zhang et al., Giant Electrostriction and Relaxor Ferroelcectric Behavior in Electron-Irradiated Poly(vinylidene Fluoride-Trifluoroethylene), Science, vol. 280 pp. 2101-2103, 1998

SUMMARY OF THE INVENTION

Accordingly, the present inventors have focused on miscibility between piezoelectric polymers, PVDF and PMMA, and they found that a piezoelectric PVDF-based polymer is suitably mixed with a specific block copolymer including PMMA miscible with the PVDF-based polymer, thereby effectively reducing an energy barrier needed for the deformation of piezoelectrics according to an electrostrictive mechanism and exhibiting excellent physical properties.

Therefore, an object of the present invention is to provide a polymer blend composition comprising PVDF and a block copolymer having PMMA, which is able to control physical properties and performances of a polymer actuator according to application purposes, and to provide an actuator film using the same.

Another object of the present invention is to provide a tunable polymer blend actuator comprising the film fabricated by using the polymer blend composition as a dielectric layer.

EFFECT OF THE INVENTION

The present invention provides a blend composition comprising a piezoelectric or ferroelectric polymer and a flexible block copolymer having an excellent miscibility therewith. When it is applied to an actuator, a tunable actuator can be fabricated, of which properties such as displacement can be controlled according to the purpose of a user only by adjusting the blend content without a complicated chemical synthetic process.

DETAILED DESCRIPTION OF THE EMBODIMENTS

Figure 1:
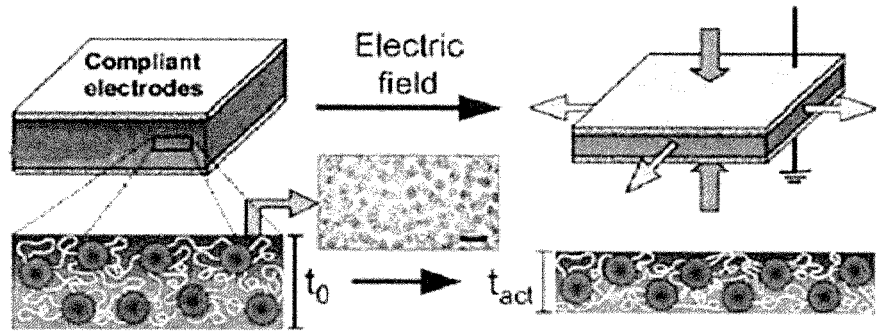
FIG. 1 is a diagram illustrating an actuation principle of the actuator of the present invention.

In order to achieve the above objects, the present invention provides a polymer blend composition comprising:
a PVDF-based polymer; and
a block copolymer that includes a soft segment containing a soft polymer repeating unit having 4 to 30 carbon atoms and a glass transition temperature of 25° C. or below, and a hard segment containing one or more poly(methylmethacrylate) repeating units.

In the soft segment, the soft polymer repeating unit may include an acrylate polymer repeating unit, a diene polymer repeating unit, or a urethane repeating unit having 4 to 30 carbon atoms and a glass transition temperature of 25° C. or below.

Preferably, the soft polymer repeating unit may be a polymer repeating unit selected from the group consisting of poly(dodecylmethacrylate), polybutylacrylate, polybutadiene, polyisoprene, polyisobutylene, polychloroprene and polyurethane repeating units.

The block copolymer may include a diblock copolymer, a triblock copolymer, a multiblock copolymer, a star-shaped block copolymer, or a graft copolymer.

Preferably, the block copolymer may include a repeating unit represented by the following Chemical Formula 1 or 2.

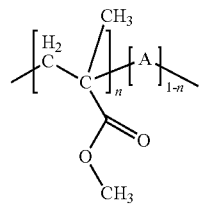

[Chemical Formula 1]

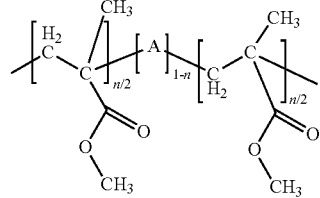

[Chemical Formula 2]

wherein A may be each independently a polymer repeating unit selected from the group consisting of poly(dodecylmethacrylate), polybutylacrylate, polybutadiene, polyisoprene, polyisobutylene, polychloroprene and polyurethane repeating units having a glass transition temperature of 0° C. or below, and n is 0.1≤n≤0.8, and more preferably 0.2≤n≤0.6.

Example of the repeating unit of Chemical Formula 2 may include the structure represented by the following Chemical Formula 2-1.

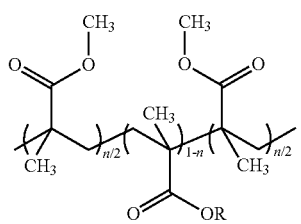

[Chemical Formula 2-1]

wherein R is an alkyl group having 4 to 30 carbon atoms, and n is 0.1≤n≤0.8, and more preferably 0.2≤n≤0.6.

More preferably, the repeating unit of Chemical Formula 2 may include the structure represented by the following Chemical Formula 2-2.

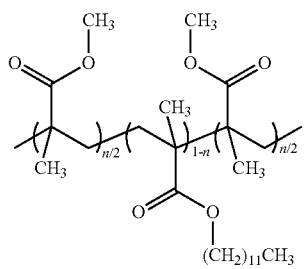

[Chemical Formula 2-2]

wherein n is 0.1≤n≤0.8, and more preferably 0.2≤n≤0.6.

Further, the block copolymer may include 10 to 90% by weight of the soft segment, based on the total weight of the block copolymer.

Further, the block copolymer may be included in an amount of 1 to 99% by weight, preferably 1 to 90% by weight, based on the total weight of the polymer blend composition.

Further, the present invention provides an actuator film fabricated by using the polymer blend composition.

Further, the present invention provides a tunable actuator comprising:

a dielectric layer including the actuator film; and top and bottom electrodes formed on each of the top and bottom surfaces of the dielectric layer.

Further, the present invention provides a method for fabricating a tunable actuator comprising the steps of:

mixing a piezoelectric or ferroelectric PVDF-based polymer with one or more block copolymers having a miscibility with the PVDF-based polymer so as to prepare the polymer blend composition;

molding the polymer blend composition in a film type so as to form a dielectric layer; and forming top and bottom electrodes on each of the top and bottom surfaces of the dielectric layer, in which the block copolymer includes a soft segment containing a soft polymer repeating unit having 4 to 30 carbon atoms and a glass transition temperature of 25° C. or below, and a hard segment containing one or more poly(methylmethacrylate) repeating units.

Hereinafter, the present invention will be described in detail.

The present invention relates to a polymer blend composition capable of controlling physical properties and performances of a polymer actuator according to application purposes, by using a piezoelectric or ferroelectric PVDF-based polymer and a specific block copolymer including PMMA miscible with the PVDF-based polymer, and to a tunable polymer blend actuator fabricated by using the same.

According to the preferred embodiment, the present invention provides a polymer blend composition comprising a PVDF-based polymer; and a block copolymer that includes a soft segment containing a soft polymer repeating unit having a glass transition temperature (Tg) of 25° C. or below and 4 to 30 carbon atoms, preferably 4 to 20 carbon atoms, and a hard segment containing one or more poly(methylmethacrylate) repeating units.

That is, the present invention is characterized in that it provides a blend of a piezoelectric or ferroelectric PVDF-based polymer and a flexible block copolymer that includes one or more PMMAs as a polymer block being miscible with the PVDF-based polymer. In short, the present invention provides a method for controlling performances and physical properties of an actuator by blending two polymers with different physical properties to make them miscible with each other.

Then, the block copolymer used in the polymer blend composition will be described in more detail with reference to drawings.

FIG. 1 is a diagram illustrating an actuation principle of the actuator of the present invention. As shown in FIG. 1, the actuator including a dielectric layer and top/bottom electrodes is compressed along a thickness direction while expanded along a lateral direction when a voltage is applied to the top and bottom electrodes. At this time, if the matrix is a piezoelectric material, displacement values can be obtained in a wide range, but it has smaller displacement values, considering the applied driving voltage. If an elastomer is used, it has an advantage of having flexibility and large displacement values. Therefore, the present invention is intended to develop a polymer blend actuator that is more stable and has adjustable displacement by blending a piezoelectric matrix and a flexible elastomer.

Accordingly, the present invention provides a polymer blend composition having the above described composition, thereby obtaining the effect of uniformly dispersing the block copolymer in PVDF due to miscibility between PVDF and PMMA. Further, the present invention does not need a complicated chemical synthetic process at each time, and the strain can be adjusted according to the purpose of a user only by varying the composition thereof.

In particular, the block copolymer used in the present invention includes the PMMA block miscible with the piezoelectric or ferroelectric PVDF-based polymer, as well as a soft polymer capable of providing flexibility in other block.

Preferably, the block copolymer includes a hard segment containing one or more PMMAs and a soft segment containing a soft polymer repeating unit having 4 to 30 carbon atoms and a glass transition temperature of 25° C. or below, preferably 0° C. or below (Tg<0° C.).

Due to the composition of including the soft polymer, the block copolymer provides the blend composition with flexibility, as well as elasticity. Further, the soft polymer repeating unit block included in the block copolymer of the present invention imparts ductility to the physical property of the final blend, which helps to improve the electrical and mechanical behavior. Therefore, the actuator of the present invention is provided with excellent miscibility and ductility so as to have greatly improved physical properties, compared to the existing actuators.

In this connection, the soft polymer may include one or more repeating units selected from the group consisting of copolymers and block copolymers having 4 to 30 carbon atoms and a glass transition temperature of 25° C. or below. Preferably, the soft polymer repeating unit in the block copolymer according to the present invention may include an acrylate polymer repeating unit, a diene polymer repeating unit, or a urethane repeating unit having 4 to 30 carbon atoms and a glass transition temperature of 0° C. or below.

According to one embodiment of the present invention, the soft polymer repeating unit in the block copolymer may be a polymer repeating unit selected from the group consisting of poly(dodecylmethacrylate), polybutylacrylate, polybutadiene, polyisoprene, polyisobutylene, polychloroprene, and polyurethane. Most preferably, the soft polymer repeating unit in the block copolymer may include a poly(dodecylmethacrylate) (hereinafter, referred to as PDMA) repeating unit having a long chain and a glass transition temperature of 0° C. or below. However, the present invention is not limited thereto, and any polymer repeating unit may be included in the block of the block copolymer to constitute the soft segment, as long as it is able to provide ductility and has a glass transition temperature of 25° C. or below, preferably 0° C. or below.

The block copolymer may include a diblock copolymer, a triblock copolymer, a multiblock copolymer, a star-shaped block copolymer, or a graft copolymer.

Preferably, the block copolymer of the present invention may include a repeating unit represented by the following Chemical Formula 1 or 2.

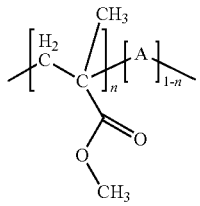

[Chemical Formula 1]

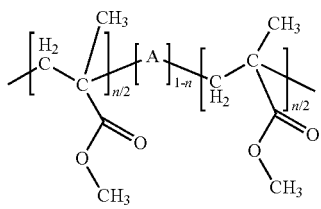

[Chemical Formula 2]

wherein A may be each independently a polymer repeating unit selected from the group consisting of poly(dodecylmethacrylate), polybutylacrylate, polybutadiene, polyisoprene, polyisobutylene, polychloroprene and polyurethane repeating units having a glass transition temperature of 0° C. or below, and n is 0.1≤n≤0.8, and more preferably 0.2≤n≤0.6.

More preferably, the block copolymer may include a repeating unit represented by Chemical Formula 2, which includes two PMMA repeating units mediated by the soft polymer repeating unit. Example of the repeating unit of Chemical Formula 2 may include the structure represented by the following Chemical Formula 2-1.

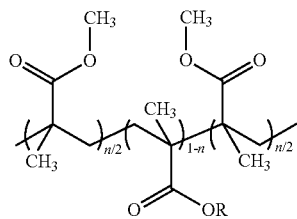

[Chemical Formula 2-1]

wherein R is an alkyl group having 4 to 30 carbon atoms, and n is 0.1≤n≤0.8, and more preferably 0.2≤n≤0.6.

More preferably, the repeating unit of Chemical Formula 2 may include the structure represented by the following Chemical Formula 2-2.

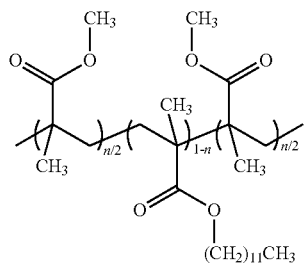

[Chemical Formula 2-2]

wherein n is 0.1≤n≤0.8, and more preferably 0.2≤n≤0.6.

Then, a method for using the block copolymer in the present invention will be described in more detail with reference to the structure of Chemical Formula 2-2.

Figure 2:
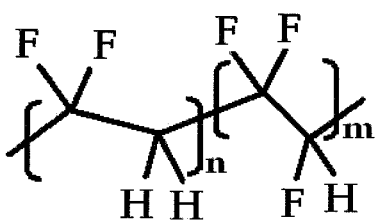
FIG. 2 is a diagram illustrating a nanostructure that is formed by the blend of PVDF-based polymer(PVDF-TrFE)/PMMA-b-PDMA-b-PMMA block copolymer according to one embodiment of the present invention.
Figure 2:
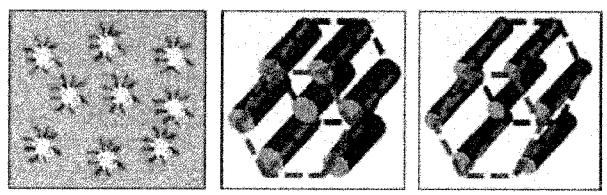

In the present invention, the block copolymer of Chemical Formula 2-2 used in the blending in order to provide the PVDF-based polymer with the property of adjustable displacement is a PMMA-b-PDMA-b-PMMA block copolymer, in which microphase separation occurs due to immiscibility between PMMA and PDMA blocks and various nanostructures are formed according to the composition. A multidomain structure attributed to the nanostructures has an interface between the domains, which is not present in homopolymers. This is illustrated in FIG. 2.

However, when an external electric field is applied, interfacial polarization is induced in the interface between multidomains showing different dielectric properties, and the interfacial polarization greatly affects improvement of actuation displacement of elastomers. In the present invention, therefore, the flexible block copolymer having a specific structure is used together with the PVDF-based polymer, thereby providing a stable actuator having adjustable displacement.

In particular, since the PMMA-b-PDMA-b-PMMA block copolymer of Chemical Formula 2-2 consists of the PDMA block that has a glass transition temperature lower than room temperature (25° C.) to show flexibility at room temperature and the PMMA terminal blocks that function as a hard segment, it shows elastomeric properties without specific crosslinking and tunable actuation displacements by varying the composition and molecular weight, and also has excellent electrical and mechanical properties in itself. That is, the following structure of Chemical Formula 2-2 includes the PDMA structure having a glass transition temperature of 0° C. or below, and this structure provides flexibility.

[Chemical Formula 2-2]

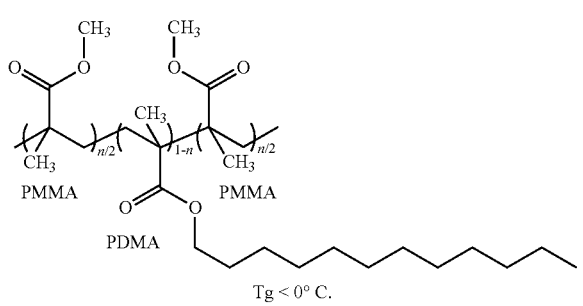

Tg < 0° C.

wherein n is 0.1≤n≤0.8, and more preferably 0.2≤n≤0.6.

Figure 3:
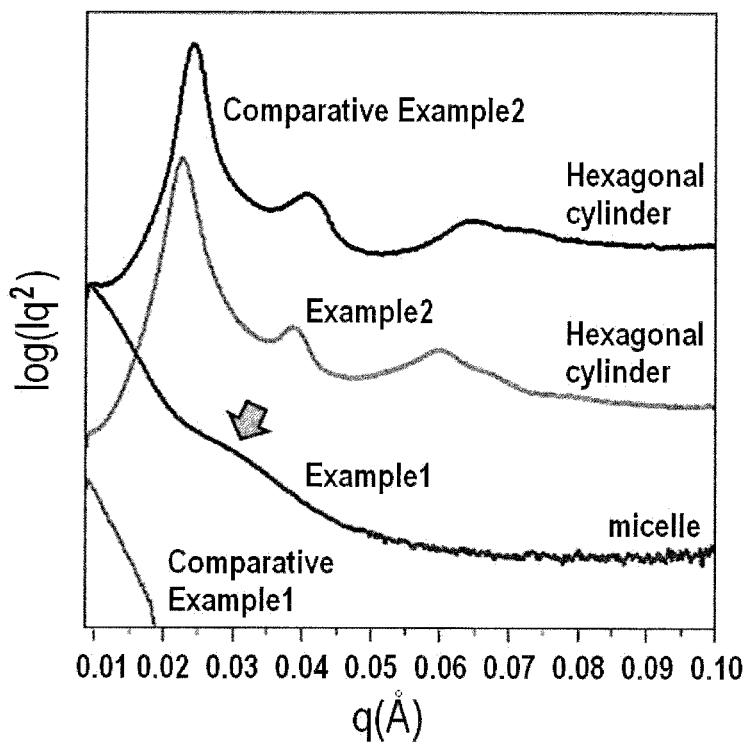
FIG. 3 is x-ray analysis and transmission electron microscopy (TEM) images of the nanostructure that is formed by the blend of PVDF-based polymer(PVDF-TrFE)/PMMA-b-PDMA-b-PMMA block copolymer according to one embodiment of the present invention.
Figure 3:
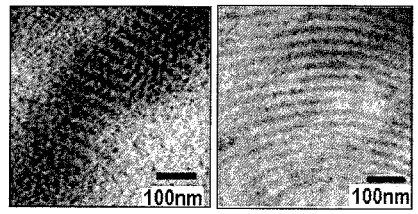
Figure 3:
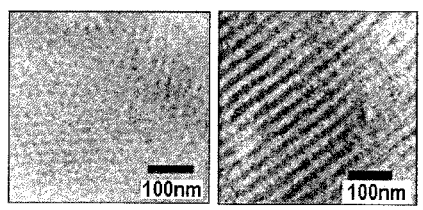
Figure 3:
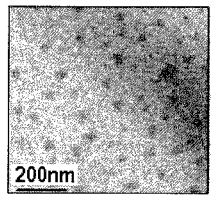

Further, in the blend polymer formed by adding the PMMA-b-PDMA-b-PMMA block copolymer of Chemical Formula 2-2 to the PVDF-based polymer, the block copolymer is very uniformly dispersed in PVDF so as to form various nanostructures, supporting that PVDF is completely miscible with PMMA by interaction therebetween. FIG. 3 shows nanostructures of the blend and peak analysis of SAXS (Small Angle X-ray Scattering).

When the PMMA-b-PDMA-b-PMMA block copolymer of Chemical Formula 2-2, which has the flexible PDMA block, is blended, more improved strain can be obtained, as compared to use of the PVDF-based polymer only.

Meanwhile, the hard segment in the block copolymer may be included in an amount of 1 to 90% by weight, preferably 1 to 80% by weight, based on the total weight of the block copolymer. Thus, the soft segment including the soft polymer may be included in the block copolymer in a residual amount.

Further, the block copolymer may be prepared by two-step ATRP (atom transfer radical polymerization). The method is not particularly limited, and it may be prepared by a polymerization method well known in the art. For example, the method of the present invention may include the steps of preparing a copolymer or a block copolymer by polymerization of one or more monomers having 4 to 30 carbon atoms and a glass transition temperature of 25° C. or below, preferably 0° C. or below, so as to form a soft polymer repeating unit, and reacting the soft polymer repeating unit with PMMA as a macroinitiator to form a block.

Through this method, the block copolymer according to the present invention includes the above described PMMA block and the soft polymer repeating unit in its structure, and may form a diblock copolymer, a triblock copolymer, a multiblock copolymer, a star-shaped block copolymer, or a graft copolymer.

Meanwhile, the block copolymer in the present invention may be included in an amount of 1 to 99% by weight, based on the total weight of the polymer blend composition.

Further, the PVDF-based polymer may be one or more selected from the group consisting of homopolymers, copolymers and terpolymers including vinylidene fluoride. Preferably, the PVDF-based polymer may be one or more selected from the group consisting of poly(vinylidene fluoride-co-trifluoroethylene), poly(vinylidene fluoride-co-trifluoroethylene-co-chlorofluoroethylene), poly(vinylidenefluoride-co-hexafluorothyelene), and poly(vinylidenefluoride-co-hexafluoroethyelene).

The polymer blend composition of the present invention is able to provide a more stable tunable actuator by controlling the displacement values according to the blend content of two ingredients.

Meanwhile, the present invention provides an actuator using a polymer blend capable of controlling the displacement values according to the blend content, and a fabrication method thereof.

In order to achieve this, another embodiment of the present invention provides an actuator film fabricated using the polymer blend composition. In the present invention, the fabricated film is used for the fabrication of a tunable actuator. The present invention is able to provide the above described film, which is fabricated using the polymer blend composition including the block copolymer containing the polymer having a long chain as a soft segment, with elasticity. Therefore, the dielectric layer is able to function as an elastic dielectric layer.

Therefore, still another embodiment of the present invention provides a tunable actuator comprising a dielectric layer including the actuator film, and top and bottom electrodes formed on each of the top and bottom surfaces of the dielectric layer.

Still another embodiment of the present invention provides a method for fabricating the tunable actuator, comprising the steps of preparing the polymer blend composition; blending the piezoelectric or ferroelectric PVDF-based polymer with one or more block copolymers miscible with the PVDF-based polymer so as to mold the polymer blend composition in a film type, thereby forming a dielectric layer; and forming top and bottom electrodes on each of the top and bottom surfaces of the dielectric layer.

That is, the present invention is intended to provide a tunable actuator comprising: a dielectric layer that includes a blend of the piezoelectric PVDF-based polymer with a block copolymer including the PMMA blocks miscible with the PVDF-based polymer, a top electrode attached to one surface of the dielectric layer, and a bottom electrode attached to the other surface of the dielectric layer, which is the opposite side of the top electrode.

In this connection, the film used as the dielectric layer may have a thickness of 10 μm to 2,000 μm. In addition, a thickness of the top and bottom electrodes is not particularly limited, and may be suitably adjusted within the typical range.

Further, the top and bottom electrodes may include conductive metals or metal oxides, conductive polymers that are used in typical semiconductor devices. Examples of the conductive polymers include polypyrrole, 3,4-ethylene dioxythiophene, polyaniline, polypiperazine, polyacetylene or the like.

As mentioned above, the tunable actuator provided by the method of the present invention consists of the dielectric layer, in which the block copolymer is uniformly dispersed in PVDF, and thus it can be fabricated by a simple method without a complicated chemical synthetic process at each time. In addition, the physical properties of the tunable actuator, such as displacement, can be improved by the uniform dispersion of the polymer in the dielectric layer. Further, the strain can be adjusted according to the purpose of a user only by varying the composition of two polymers, thereby controlling the physical properties and performance according to application purposes.

Hereinafter, the present invention will be described with reference to the following Examples and Comparative Examples. However, these Examples are for illustrative purposes only, and the invention is not intended to be limited by these Examples.

Synthesis Example 1

Preparation of PMMA-b-PDMA-b-PMMA Block Copolymer

PDMA was prepared using dodecyl methacrylate by a typical method, and PDMA was used as a macroinitiator, together with PMMA, so as to prepare a PMMA-b-PDMAb-PMMA block copolymer by two-step ATRP (atom transfer radical polymerization) for the preparation of an A-B-A type block copolymer.

In this connection, the hard segment PMMA block was used in an amount of 20 wt %, based on the total weight of the block copolymer, so as to give suitable ductility and physical properties The prepared PMMA-b-PDMA-b-PMMA block copolymer had a weight average molecular weight (Mw) of 144,000 g/mol, and its molecular structure is shown in FIG. 2.

Further, the block copolymer had a tensile modulus of approximately 8 kPa (ASTM D-882, gage length: 25 mm, w: 4 mm, t: approximately 250 µm) and a dielectric constant of approximately 5.5 (10 kHz, 25° C.).

Synthesis Example 2

Preparation of PMMA-b-PB block copolymer

First, anionic polymerization was performed using a sec-butyllithium initiator in a toluene solvent at 30° C. for 12 hrs to polymerize polybutadiene block. Then, diphenylethylene was added thereto, and reacted with butadiene leaving ions to substitute with diphenylethylene anions, followed by reaction with methyl-methacrylate at −78° C. Finally, a poly(methylmethacrylate)-b-butadiene block copolymer of Chemical Formula 1-1 was prepared. Approximately 25 wt % of poly(methylmethacrylate) was included in the prepared PMMA-b-PB block copolymer. The prepared PMMA-b-PB had a weight average molecular weight (Mw) of 52,000 g/mol.

Further, the block copolymer had a tensile modulus of approximately 40 kPa (ASTM D-882, gage length: 25 mm, w: 4 mm, t: approximately 250 µm) and a dielectric constant of approximately 4.0 (10 kHz, 25° C.).

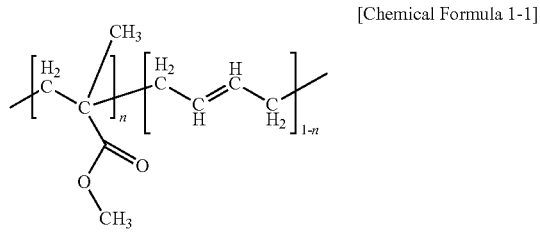

[Chemical Formula 1-1]

(wherein n is the same as defined the above)

Example 1

PVDF/PMMA-b-PDMA-b-PMMA=85/15

Based on the total weight of the matrix, 85% by weight of poly(vinylidene fluoride-co-trifluoroethylene [product name: VF2-TrFe copolymer(65/35 w % VDF-TRFE)] purchased from Solvay solexis, Inc. and 15% by weight of the PMMA-b-PDMA-b-PMMA block copolymer (20% PMMA content) of Synthesis Example 1 were mixed with each other, and the two polymers were dissolved well in a solvent (tetrahydrofuran) under stirring for one day, so as to prepare a blend solution.

Subsequently, in order to prepare a matrix in a film type, a predetermined amount of the blend solution was put in a petri dish and slowly dried under the used solvent environment, so as to prepare a film with a thickness of 100~200 micrometers. The film was cut to have a length and width of 20 mm, and both surfaces thereof were painted with carbon grease in a 10 mm diameter circle, so as to fabricate an actuator film.

The fabricated film was used as a dielectric layer to form top and bottom electrodes on the top and bottom surfaces of the dielectric layer by a typical method.

Example 2

PVDF/PMMA-b-PDMA-b-PMMA=10/90

An actuator film was fabricated in the same manner as in Example 1, except that 10% by weight of poly(vinylidene fluoride-co-trifluoroethylene and 90% by weight of the PMMA-b-PDMA-b-PMMA block copolymer were mixed with each other, based on the total weight, so as to fabricate a film with a thickness of 500 µm, and both surfaces thereof were painted with carbon grease in a 10 mm diameter circle.

Example 3

PVDF/PMMA-b-PB=85/15

An actuator film was fabricated in the same manner as in Example 1, except for using 15% by weight of the PMMA-b-PB block copolymer prepared in Synthesis Example 2. In this connection, PMMA-b-PB had a weight average molecular weight of 52,000 g/mol.

Comparative Example 1

PVDF

An actuator film was fabricated in the same manner as in Example 1, except that PVDF-TrFE purchased from Solvay solexis, Inc. was only used as a polymer for the dielectric layer formation without blending with other polymers.

Comparative Example 2

PMMA-b-PDMA-b-PMMA

An actuator film was fabricated in the same manner as in Example 1, except that 100% by weight of the triblock copolymer prepared in Synthesis Example 1 was only used as a polymer for the dielectric layer formation.

Experimental Example

1. Evaluation of Miscibility Between PVDF and Block Copolymer

FIG. 3 shows SAXS (Small Angle X-ray Scattering) profile and transmission electron microscopy (TEM) images of the nanostructures of Example 1-2 and Comparative Example 1-2.

As shown in FIG. 3, the blend polymer of Example 1-2 that was prepared by addition of the PMMA-b-PDMA-b-PMMA block copolymer to the PVDF-based polymer was found to form various nanostructures where the block copolymer is very uniformly dispersed in the PVDF-based polymer. This is attributed to a phenomenon that interaction between PVDF and PMMA occurs to have complete miscibility with each other and microphase separation occurs due to immiscibility between PVDF and PDMA.

Meanwhile, in Comparative Example 1, either the PVDF-based polymer was only included, and thus the nanostructure of the present invention was not formed.

2. Test on Electrical and Mechanical Behavior of PVDF/Block Copolymer Blend

In order to evaluate the electrical and mechanical energy conversion efficiency, a thickness strain (Sz) compressed in a thickness direction was measured when a voltage is applied. Two laser sensors were used to measure displacement values of the polymer composite actuator due to electrical and mechanical responses to an applied voltage. The values were calculated using the following Equation 1.

$$Sz(\%) = t/t_o \times 100 \qquad \text{Equation 1}$$

(wherein $t_o$ and t represent the sample thickness before and after applying a voltage, respectively)

Figure 4:
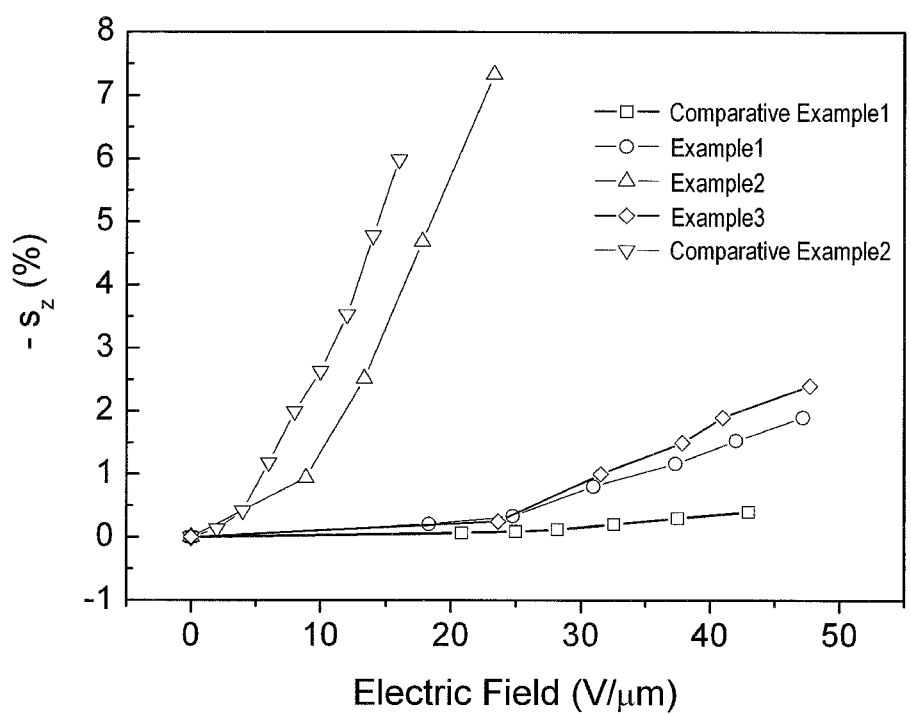
FIG. 4 is a graph showing electrical and mechanical displacement values of the actuators according to Example 1-3 and Comparative Example 1-2.

In addition, FIG. 4 shows electrical and mechanical displacement values of the actuators according to Example 1-3 and Comparative Example 1-2.

That is, FIG. 4 shows actuation behavior of the actuators, compressed in a thickness direction due to conversion of electrical energy into mechanical energy by the dielectric layers according to Examples and Comparative Examples when a voltage is applied, and means a thickness strain (Sz) compressed in a thickness direction.

As shown in FIG. 4, PVDF and PMMA-b-PDMA-b-PMMA form a blend having excellent miscibility between PVDF and PMMA, and electrical and mechanical displacement can be controlled according to the composition of the formed blend. In addition, PMMA-b-PB also forms a stable blend, thereby controlling electrical and mechanical properties of PVDF.

3. Comparison Test on Displacement Values of Example 1-3 and Comparative Example 1-2

The displacement values of Example 1-3 and Comparative Example 1-2 are shown in the following Table 1. In addition, the tensile modulus values of Example 1-2 and Comparative Example 1-2 are shown in FIG. 5.

TABLE 1

| | k | 100 Hz | 1 KHz | 10 KHz | 100 KHz |
|---|---|---|---|---|---|
| Comparative Example 1 | PVDF | 9.67 | 9.47 | 9.23 | 8.61 |
| Example 1 | PVDF/PMMA-b-PDMA-b-PMMA = 85/15 | 7.53 | 7.34 | 7.06 | 6.65 |
| Example 2 | PVDF/PMMA-b-PDMA-b-PMMA = 10/90 | 6.84 | 6.56 | 6.07 | 5.71 |
| Example 3 | PVDF/PMMA-b-PB = 85/15 | 4.35 | 4.13 | 4.00 | 3.88 |
| Comparative Example 2 | PMMA-b-PDMA-b-PMMA | 6.15 | 5.97 | 5.49 | 5.15 |

Figure 5:
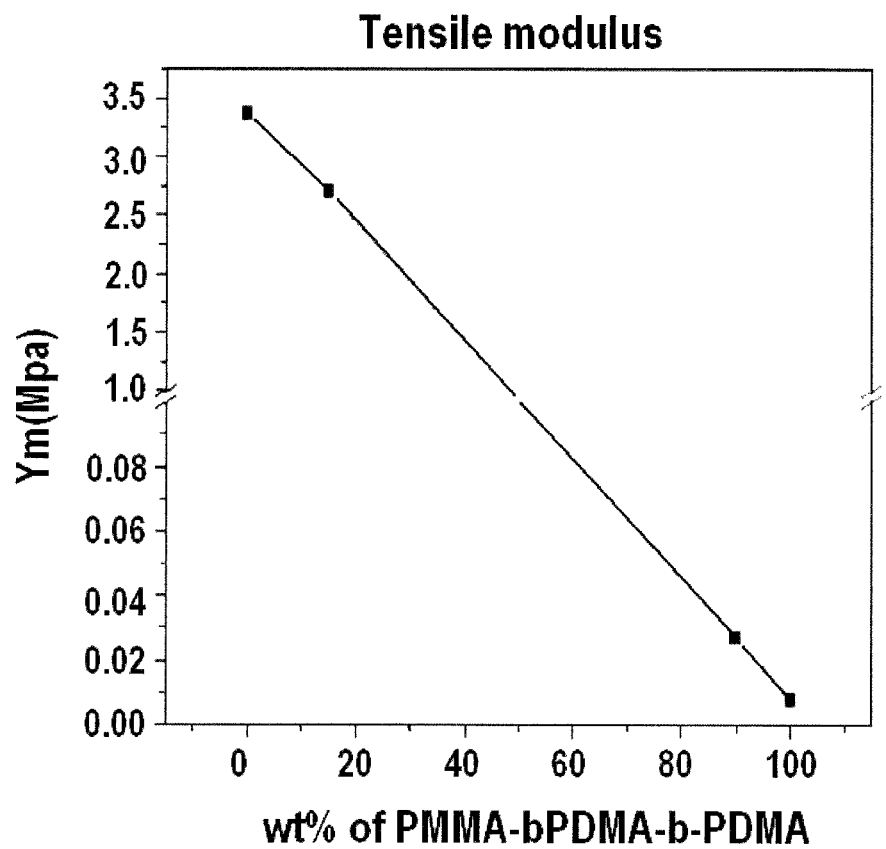
FIG. 5 is a graph showing measured tensile modulus values of Example 1-2 and Comparative Example 1-2.

FIG. 5 and Table 1 show effects of the blend on the mechanical properties and permittivity behavior by varying the content of the PMMA-b-PDMA-b-PMMA block copolymer. FIG. 5 shows that the strain relative to the applied stress (electric field) increases, as the content of the flexible block copolymer increases, which is attributed to a reduction in tensile modulus, as shown in the measured tensile modulus of FIG. 5.

Further, the increased strain is affected by dielectric constant, polarization, and modulus of dielectrics. As the PMMA-b-PDMA-b-PMMA block copolymer is added to PVDF, the dielectric constant and modulus reduced (see Table 1 and FIG. 5).

Furthermore, the PMMA-b-PB of Example 3 was also found to have a reduced dielectric constant.

Therefore, it can be seen that the increased displacement of the blend comprising the PVDF-based polymer and the block copolymer including the PMMA block is attributed to the reduced modulus due to the content increase of the flexible polymer in the present invention.

INDUSTRIAL APPLICABILITY

In the present invention, a soft elastomeric block copolymer is introduced into a piezoelectric polymer, which is efficiently applicable to polymer actuators. Further, the present invention is applicable to speaker panels, sound operators, and robot hands, and displacements suitable for the purpose of a user can be obtained by adjusting the composition and content of the block copolymer without a complicated chemical synthetic process, thereby being more easily industrialized.

What is claimed is:

1. A tunable actuator, comprising:
   a dielectric layer including an actuator film fabricated using a polymer blend composition, and
   top and bottom electrodes formed on each of the top and bottom surfaces of the dielectric layer,
   wherein the polymer blend composition comprising:
   a PVDF-based polymer, wherein the PVDF-based polymer is a copolymer including vinylidene fluoride; and
   a block copolymer that includes a soft segment containing a soft polymer repeating unit having 4 to 30 carbon atoms and a glass transition temperature of 25° C. or below, and a hard segment containing one or more poly (methylmethacrylate) repeating units.

2. The tunable actuator according to claim 1, wherein in the soft segment, the soft polymer repeating unit includes an acrylate polymer repeating unit having 4 to 30 carbon atoms and a glass transition temperature of 0° C. or below.

3. The tunable actuator according to claim 1, wherein the block copolymer is a a triblock copolymer.

4. The tunable actuator according to claim 1, wherein the block copolymer comprises a repeating unit represented by the following Chemical Formula 1 or 2:

[Chemical Formula 1]

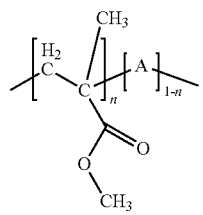

wherein A is each independently a polymer repeating unit selected from the group consisting of polybutadiene, polyisoprene, polyisobutylene, polychloroprene and polyurethane repeating units having a glass transition temperature of 0° C. or below, and n is a molar fraction, $0.1 \le n \le 0.8$,

[Chemical Formula 2]

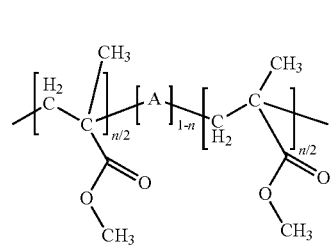

wherein A is each independently a polymer repeating unit selected from the group consisting of polybutadiene, polyisoprene, polyisobutylene, polychloroprene and polyurethane repeating units having a glass transition temperature of 0° C. or below, and n is a molar fraction, $0.1 \le n \le 0.8$.

5. The tunable actuator according to claim 1, wherein the block copolymer comprises a repeating unit represented by the following Chemical Formula 2-1:

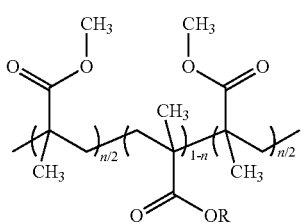

[Chemical Formula 2-1]

wherein R is an alkyl group having 4 to 26 carbon atoms, and n is molar fraction, $0.1 \leq n \leq 0.8$.

6. The tunable actuator according to claim 1, wherein the block copolymer comprises a repeating unit represented by the following Chemical Formula 2-2:

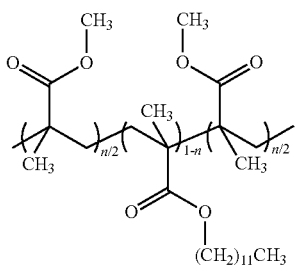

[Chemical Formula 2-2]

wherein n is molar fraction, $0.1 \leq n \leq 0.8$.

7. The tunable actuator according to claim 1, wherein the block copolymer includes 10 to 90% by weight of the hard segment, based on the total weight of the block copolymer.

8. A method for fabricating the tunable actuator, comprising the steps of:
blending a piezoelectric or ferroelectric PVDF-based polymer with one or more block copolymers miscible with the PVDF-based polymer, wherein the PVDF-based polymer is a copolymer including vinylidene fluoride, and the one or more block copolymer includes a soft segment containing a soft polymer repeating unit having 4 to 30 carbon atoms and a glass transition temperature of 25° C. or below, and a hard segment containing one or more poly(methylmethacrylate) repeating units;
molding the polymer blend composition in a film type so as to form a dielectric layer; and
forming top and bottom electrodes on each of the top and bottom surfaces of the dielectric layer,
wherein the block copolymer includes a soft segment containing a soft polymer repeating unit having 4 to 30 carbon atoms and a glass transition temperature of 25° C. or below, and a hard segment containing one or more poly(methylmethacrylate) repeating units.

9. A tunable actuator, comprising:
a dielectric layer including an actuator film fabricated using a polymer blend composition, and
top and bottom electrodes formed on each of the top and bottom surfaces of the dielectric layer,
wherein the polymer blend composition comprising:
PVDF; and
a block copolymer that includes a soft segment containing a soft polymer repeating unit having 4 to 30 carbon atoms and a glass transition temperature of 25° C. or below, and a hard segment containing one or more poly (methylmethacrylate) repeating units,
wherein the block polymer is uniformly dispersed in the PVDF.

* * * * *